(12) United States Patent
Lee et al.

(10) Patent No.: US 11,100,993 B2
(45) Date of Patent: Aug. 24, 2021

(54) TCAM ARCHITECTURE WHERE CONTENT-BASED SEARCH IS CONDUCTIBLE

(71) Applicant: INDUSTRY-ACADEMIC COOPERATION FOUNDATION CHOSUN UNIVERSITY, Gwangju (KR)

(72) Inventors: Jeong A Lee, Gwangju (KR); Inayat Ullah, KPK (PK); Zahid Ullah, Peshawar (PK)

(73) Assignee: INDUSTRY-ACADEMIC COOPERATION FOUNDATION CHOSUN UNIVERSITY, Gwangju (KR)

( * ) Notice: Subject to any disclaimer, the term of this patent is extended or adjusted under 35 U.S.C. 154(b) by 0 days.

(21) Appl. No.: 16/703,319

(22) Filed: Dec. 4, 2019

(65) Prior Publication Data
US 2020/0185031 A1 Jun. 11, 2020

(30) Foreign Application Priority Data
Dec. 11, 2018 (KR) .......................... 10-2018-0158929

(51) Int. Cl.
| | | |
|---|---|---|
| G11C 15/00 | (2006.01) | |
| G11C 15/04 | (2006.01) | |
| H03K 19/17728 | (2020.01) | |
| H03K 19/1776 | (2020.01) | |

(52) U.S. Cl.
CPC ......... *G11C 15/04* (2013.01); *H03K 19/1776* (2013.01); *H03K 19/17728* (2013.01)

(58) Field of Classification Search
CPC ............. G11C 15/04; H03K 19/17728; H03K 19/1776
USPC ....................................................... 365/49.11
See application file for complete search history.

(56) References Cited

U.S. PATENT DOCUMENTS

| | | | |
|---|---|---|---|
| 7,233,597 B2 * | 6/2007 | Kumar | ................ H04L 45/7453 370/392 |
| 9,111,615 B1 | 8/2015 | Jiang | |
| 2017/0040059 A1 * | 2/2017 | Arsovski | ................. G06F 12/14 |
| 2018/0374538 A1 * | 12/2018 | Hayashi | ................ G06F 3/0638 |

FOREIGN PATENT DOCUMENTS

JP      2008-10144 A      1/2008

OTHER PUBLICATIONS

Office action dated Apr. 20, 2020 from Korean Patent Office in a counterpart Korean Patent Application No. 10-2018-0158929 (all the cited references are listed in this IDS) (English translation is also submitted herewith.).

* cited by examiner

*Primary Examiner* — Vu A Le
(74) *Attorney, Agent, or Firm* — The PL Law Group, PLLC

(57) ABSTRACT

According to an embodiment of the present invention, there is provided a TCAM architecture in which a content-based search is conductible in such a manner that a search key to be searched for is used as an address of a memory element that makes up a TCAM cell and that an output from the memory element reflects whether a match or a mismatch is found as a result of the search. The memory element may be a look-up table.

3 Claims, 8 Drawing Sheets

TCAM ARCHITECTURE WHERE CONTENT-BASED SEARCH IS CONDUCTIBLE

CROSS REFERENCE TO RELATED APPLICATION

The present application claims priority to Korean Patent Application No. 10-2018-0158929, filed Dec. 11, 2018, the entire contents of which is incorporated herein for all purposes by this reference.

BACKGROUND OF THE INVENTION

Field of the Invention

The present invention relates to a TCAM architecture and, more particularly, to a TCAM architecture in which a content-based search is conductible in such a manner that a search key to be searched for is used as an address of a memory element that constitutes a TCAM cell and that an output from the memory element reflects whether a match or a mismatch is found as a result of the search, in which the memory element may be a look-up table.

Description of the Related Art

A content addressable memory (CAM) is used extensively for implementing search operations of look-up tables in speed-critical applications, such as networking, microprocessor translation look-aside buffers, caching, pattern matching, and acceleration of big data processing.

CAM is a special type of memory where an input search key is compared in parallel against all stored data and an address of the matched data is the output.

CAM is classified into two categories: binary CAM (BCAM) and ternary CAM (TCAM). In BCAM, each bit represents binary states of "0" and "1". TCAM has an additional state of "don't care state x" which represents a wild-card entry.

FIG. 1 is a diagram illustrating a general 4×4 TCAM.

With reference to FIG. 1, when a search key 13 is input, a general TCAM 10 implements parallel search operations of look-up tables in an application-specific integrated circuit (ASIC) composed of TCAM cells 11a. In a case where all data in cells in a width direction are the same as the search key 13, a value of "1" is output from a match line (ML), and a priority encoder 12 outputs a match address.

In an example in FIG. 1, the search key 13 is "1100". Thus, a signal is output from a first match (ML1) in which the same data "X100" is present, and the priority encoder 12 outputs a match address "10".

TCAM has the advantage of providing high-speed look-up performance in deterministic time. However, TCAM suffers from drawbacks, such as low storage density, higher power consumption, and higher cost per bit.

SUMMARY

An objective of the present invention, which was conceived to solve the problems described above, is to provide a TCAM architecture in which, to offer high-speed single cycle search and to achieve higher energy and resource efficiency, a search key is used as an address of a memory element that constitutes a TCAM cell and, without comparison between the search key and data stored in the cell, an output from the memory element reflects whether a match or a mismatch is found as a result of a search.

Another objective of the present invention is to provide a FPGA-based TCAM architecture in which a look-up table is updated while at the same time, a search is conductible on the basis of the content of a search key, in such a manner that the content of a search key is used as an address for a bit that makes up a look-up table and that outputs from the look-up tables reflect whether a match or a mismatch is found as a result of the search.

According to an aspect of the present invention, there is provided a ternary content addressable memory (TCAM) architecture, in which one or multiple TCAM cells are provided, in which, when a search key is input, the TCAM cell outputs a match signal or a mismatch signal, in which the TCAM cell is made up of first and second memory elements, in which, in a case where a value that is the same as the search key is stored in the TCAM cell, the first and second memory elements output the match signal of "1", and in which, in a case where a value that is not the same as the search key is stored in the TCAM cell, the first and second memory elements output the mismatch signal of "0".

In the TCAM architecture, in a case where "0" has to be stored in the first or second memory element, "1" may be stored in the first memory element, and "0" may be stored in the second memory element, in a case where "1" has to be stored in the first or second memory element, "0" may be stored in the first memory element, and "1" may be stored in the second memory element, in a case where a value of "X" (don't care) has to be stored in the first or second memory, "1" may be stored in each of the first memory element and the second memory element, and, in a case where the search key is "0", a value of the first memory element may be output, and, in a case where the search key is "1", a value of the second memory element may be output.

In the TCAM architecture, multiple TCAM cells may be provided in a width direction, and output signals from the TCAM cells in the width direction may be sequentially END-cascaded, and thus a match vector that is a final match signal or mismatch signal may be output.

In the TCAM architecture, multiple TCAM cells may be provided in a depth direction, and multiple TCAM cells in a depth direction may output a match signal or a mismatch signal with respect to input of the same search key.

In the TCAM architecture, multiple TCAM cells may be provided in width and depth directions, and output signals from the TCAM cells in the same width direction may be sequentially END-cascaded, and thus a match vector that is a final match signal or mismatch signal may be output.

According to another aspect of the present invention, there is provided an FPGA-based TCAM architecture, in which multiple look-up tables are provided, in which outputs from the look-up table are AND-operated through a carry chain, and thus a final match result is output, in which each of the look-up tables has many bits, as many as the number of values that are representable by a search key that is input, in which "1" is written in a bit for an address corresponding to a value of the search key to be stored, in which "0" is written in the remaining bits, in which, when the search key to be searched for is input into each of the look-up tables, a bit value for an address corresponding to the value of the search key that is input is output, and in which, in a case where "1" is output from all the look-up tables, "1" is output as a final match result.

In the FPGA-based TCAM architecture, the search for the search key may be conducted by having direct access to a bit for the address corresponding to the value of the search key to be searched for, and, values stored in the remaining bits in the lookup table, which do not correspond to the address of the search key to be searched for, may be updated while at the same time conducting the search for the search key.

In the FPGA-based TCAM architecture, in the look-up tables, four 64-bit look-up table RAMs (LUTRAM) may have a quad port RAM structure in which three look-up table RAMs, as read ports, implements 18 TCAM bits, and one look-up table RAM functions as a write port.

The FPGA-based TCAM architecture may include a $\log_2 D$-bit decoder that outputs an update address of the look-up table RAM; a MOD-64 counter that generates and outputs a 6-bit sequence; and a comparator that compares an update word that is a value to be updated, and the 6-bit sequence of the MOD-64 counter, in which the update word and the 6-bit sequence are consistent with each other in the update address, "1" is recorded in a bit for the update address.

With a TCAM architecture according to the present invention, each TCAM cell is made up of two memory elements, and a search key is used as an address of the memory element. Thus, without comparison between the search key and data stored in the cell, an output from the memory element reflects whether a match or a mismatch is found as a result of a search. This provides the advantage of offering a high-speed single cycle search and thus achieving higher energy and resource efficiency.

In addition, with a FPGA-based TCAM architecture according to the present invention, bits for other addresses that are not currently searched for are upgraded while at the same time conducting a search, in such a manner that the content of a search key is used as an address for a bit that makes up a look-up table and that direct access to a bit that corresponds to the content of the search key is made. This provides the advantage of offering high lookup and update performance and update and reducing update latency of a single cycle.

DETAILED DESCRIPTION

Figure 1:
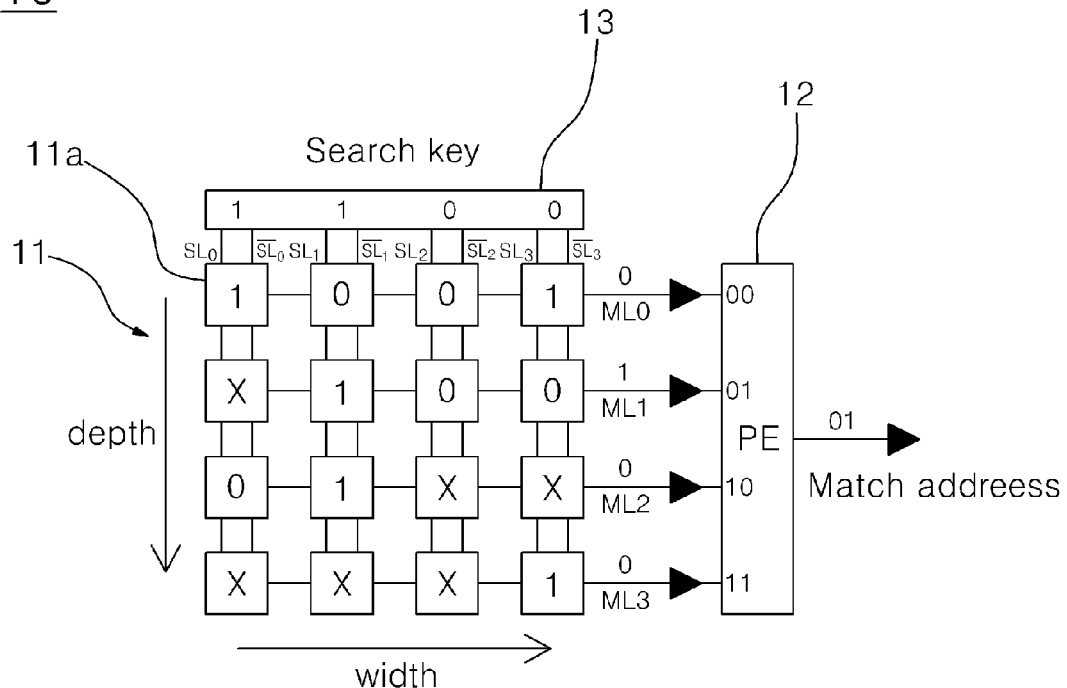
FIG. 1 is a diagram illustrating a general 4×4 TCAM.

Terms that have ordinary meanings, which are currently widely used, were selected as ones that are to be used in the present specification. However, in certain instances, there are also terms that were arbitrarily selected by the inventor. Such terms should be interpreted in light of the specification, instead of literal meanings of such terms.

Preferable embodiments of the present invention will be described in terms of technical configurations with reference to the accompanying drawings.

However, the present invention is not limited to the embodiments that are described here and may be implemented into other embodiments. The same constituent element is given the same reference character throughout the specification.

Figure 2:
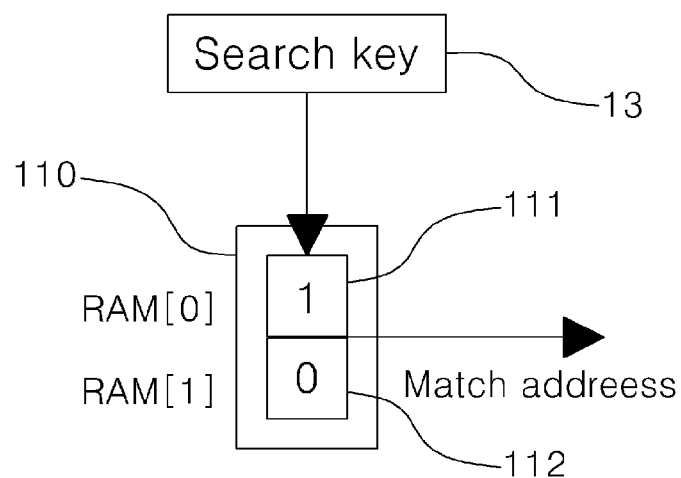
FIG. 2 is a diagram illustrating a TCAM cell having a TCAM architecture according to an embodiment of the present invention.

FIG. 2 is a diagram illustrating a TCAM cell having a TCAM architecture according to an embodiment of the present invention.

With reference to FIG. 2, a TCAM architecture 100 according to the embodiment of the present invention includes one or multiple TCAM cells 110, and, when a search key 13 is input, the CAM cell 110 outputs a match signal or a mismatch signal.

In addition, the TACM cell 110 includes first and second memory elements 111 and 112, and the content of ternary memory is stored, as 2-bit data, in the TACM cell 110.

In addition, the search key 13 is used as an address of each of the first or second memory element 111 or 112, and the content of the first or second memory element is output as a match or mismatch that results from the search.

In addition, the address of the first memory element 111 is "0" and an address of the second memory element 112 is "1".

If the content of the ternary memory "0", that is, in a case where a value of "0" has to be stored in the first and second memory elements 111 and 112, "1" is stored in the first memory element 111, and "0" is stored in the second memory element 112. In a case where the content of the ternary memory is "1", "0" is stored in the first memory element 111, and "1" is stored in the second memory element 112. In a case where the content of the ternary memory is "X" (don't care), "1" is stored in each of the first memory element 111 and the second memory element 112.

In an example in FIG. 2, "1" is stored in the first memory element 111, and "0" is stored in the second memory element 112. Thus, the content of the ternary memory is "0".

In addition, in a case where "0" is input as the search key 13, a value of "1" for the first memory element 111 is output, and this corresponds to a match signal.

However, in a case where "1" is input as the search key 13, a value of "0" for the second memory element 112 is output, and thus the result is output as a mismatch signal.

That is, the TCAM cell 110 according to the embodiment of the present invention outputs a signal stored in an address, with the search key 13 as the addresses of the first and second memory elements 111 and 112. This provides the advantage of outputting a match result without a separate comparative circuit or architecture.

Figure 3:
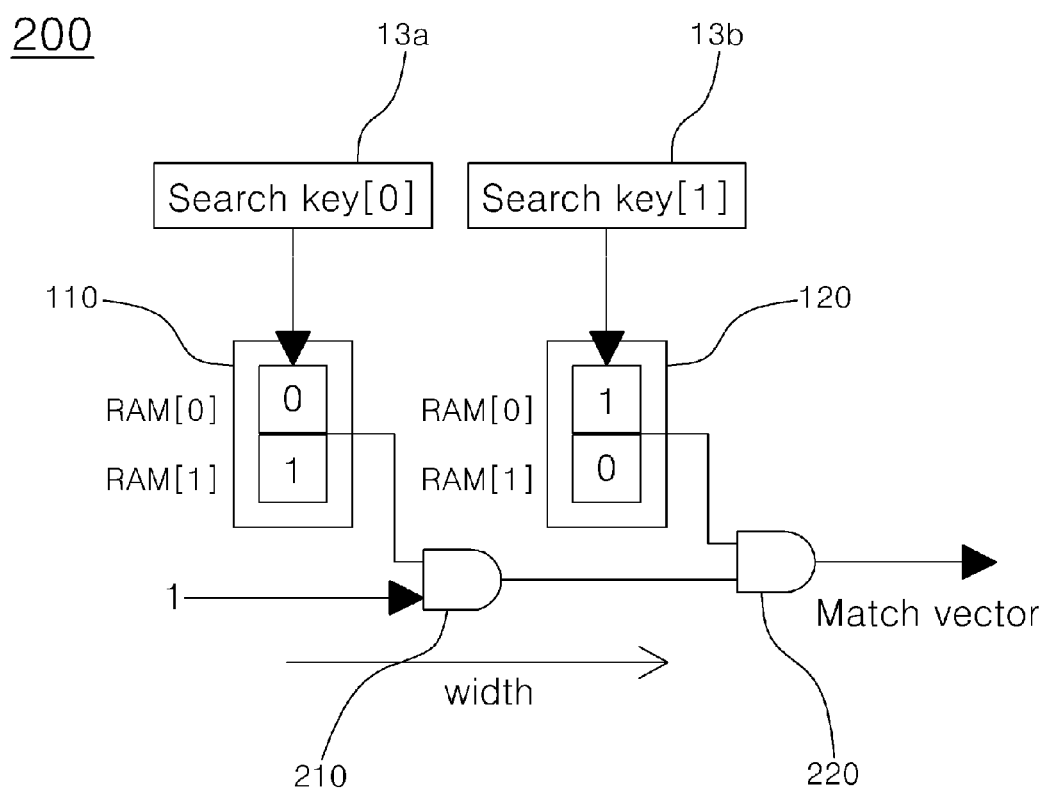
FIG. 3 is a diagram illustrating a 1×2 TCAM that results from increasing the number of TCAM cells, each being illustrated in FIG. 2, in a width direction.

FIG. 3 is a diagram illustrating a 1×2 TCAM 200 that results from increasing the number of TCAM cells, each being illustrated in FIG. 2, in a width direction.

The 1×2 TCAM 200 results from increasing the number of TCAM cells in order to perform parallel processing in a case where the search key 13 that is input is multiple bits long. Outputs from first and second TCAM cells 110 and 120 are sequentially AND-cascaded. Thus, the result is output as a match vector that is a final match or mismatch signal.

Specifically, the output from the first TCAM cell 110 is AND-cascaded with "1" by a first AND gate 210. The output from the second TCAM cell 120 is AND-cascaded with the output from the first AND gate 210 by a second AND gate 220. Thus, a final match vector is output.

That is, in a case where all outputs from the TCAM cells in the width direction are match signals, the match vector is output as a match signal.

Figure 4:
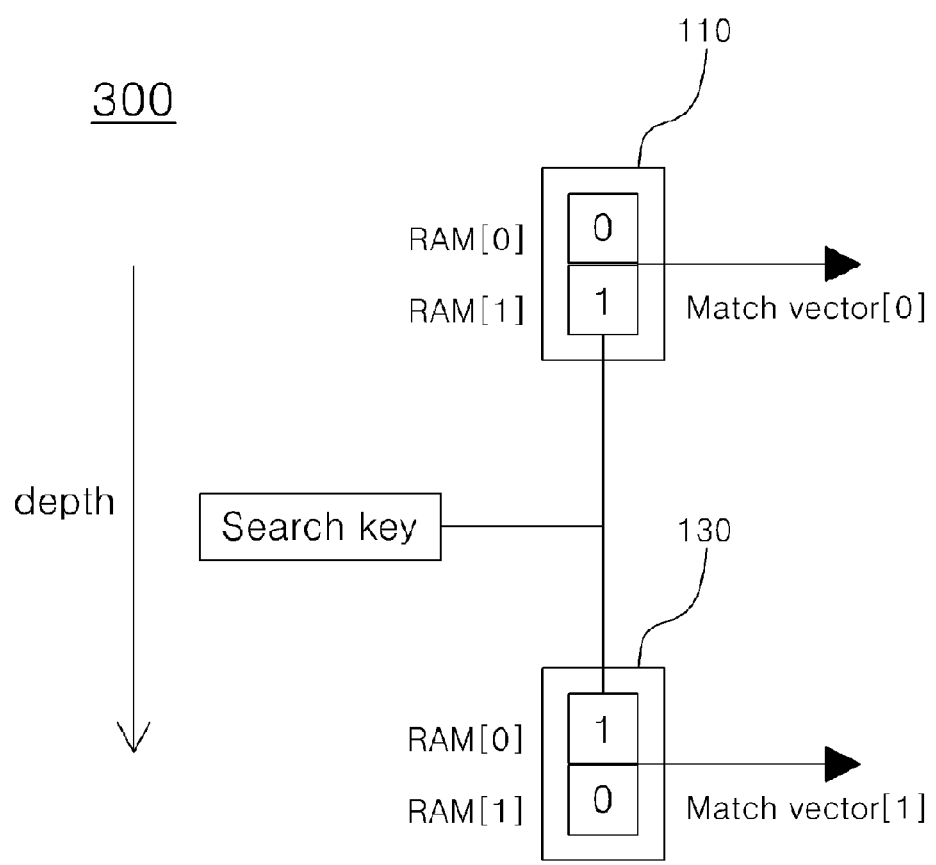
FIG. 4 is a diagram illustrating a 2×1 TCAM that results from increasing the number of TCAM cells, each being illustrated in FIG. 2, in a depth direction.

FIG. 4 is a diagram illustrating a 2×1 TCAM 300 that results from increasing the number of TCAM cells, each being illustrated in FIG. 2, in a depth direction.

The 2×1 TCAM 300 results from arranging TCAM cells 110 and 130 in the vertical direction. The same search key is input into each of the TCAM cells 110 and 130. As a result, each of the TCAM cells 110 and 130 outputs a match signal or a mismatch signal.

Figure 5:
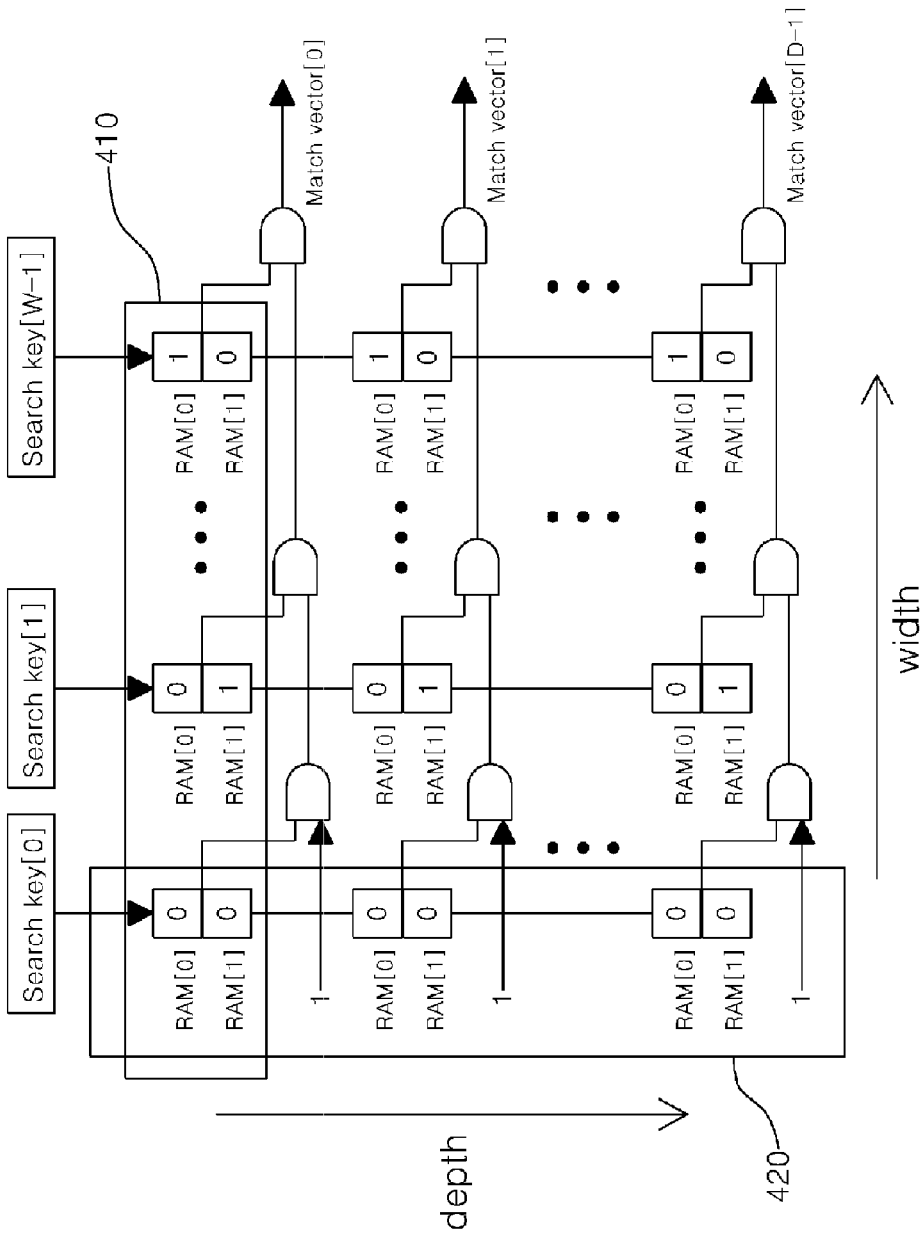
FIG. 5 is a diagram illustrating a D×W TCAM that results from increasing the number of TCAM cells, each being illustrated in FIG. 2, in the depth and width directions.

FIG. 5 is a diagram illustrating a D×W TCAM that results from increasing the number of TCAM cells, each being illustrated in FIG. 2, in the depth and width directions.

The same search key is input into TCAM cells 420 arranged in the depth direction, and outputs from TCAM cells 410 arranged in the width direction are sequentially AND-cascaded. Thus, a match vector is output.

Figure 6:
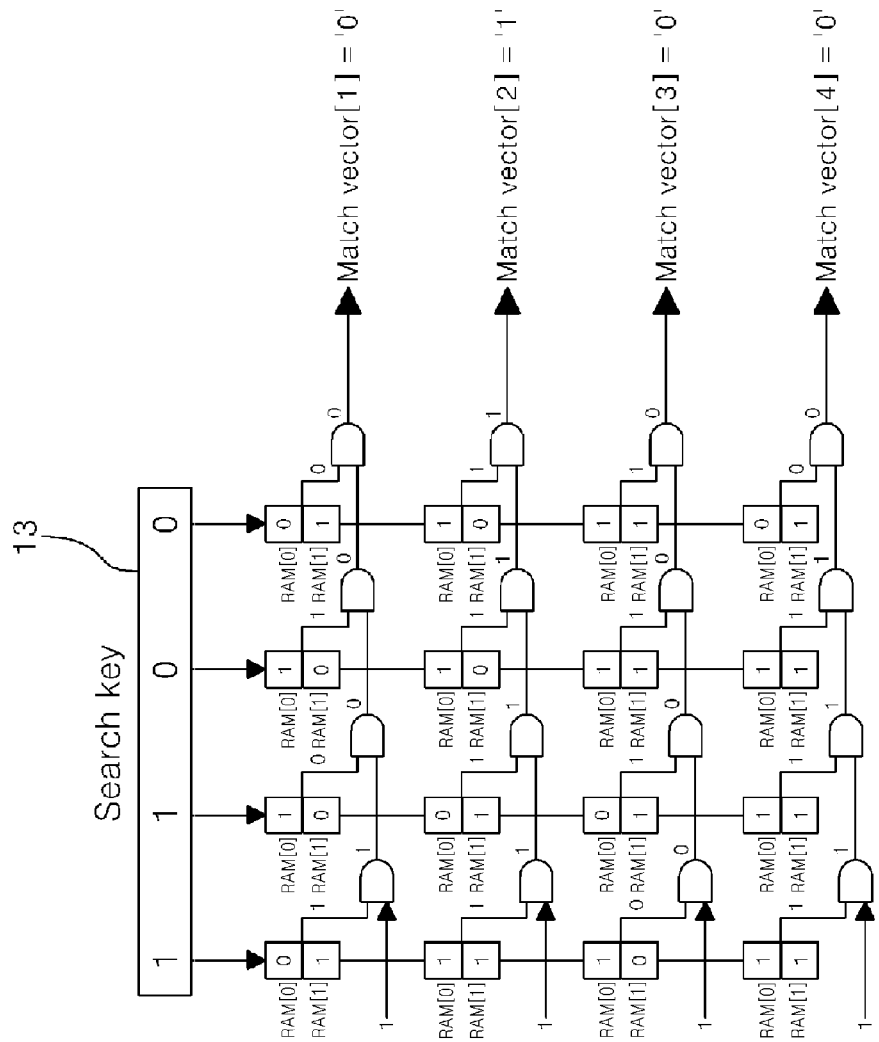
FIG. 6 is a diagram illustrating an example where the 4×4 TCAM in FIG. 1 is realized by employing the TCAM architecture according to the present invention.

FIG. 6 is a diagram illustrating an example 500 where the 4×4 TCAM in FIG. 1 is realized by employing the TCAM architecture according to the present invention. In a case where the search key 13, that is, "1100", is input, it is seen from FIG. 6 that a match signal is output in a match vector [2]. The match signal is provided to the priority encoder. The priority encoder outputs a match address.

Figure 7:
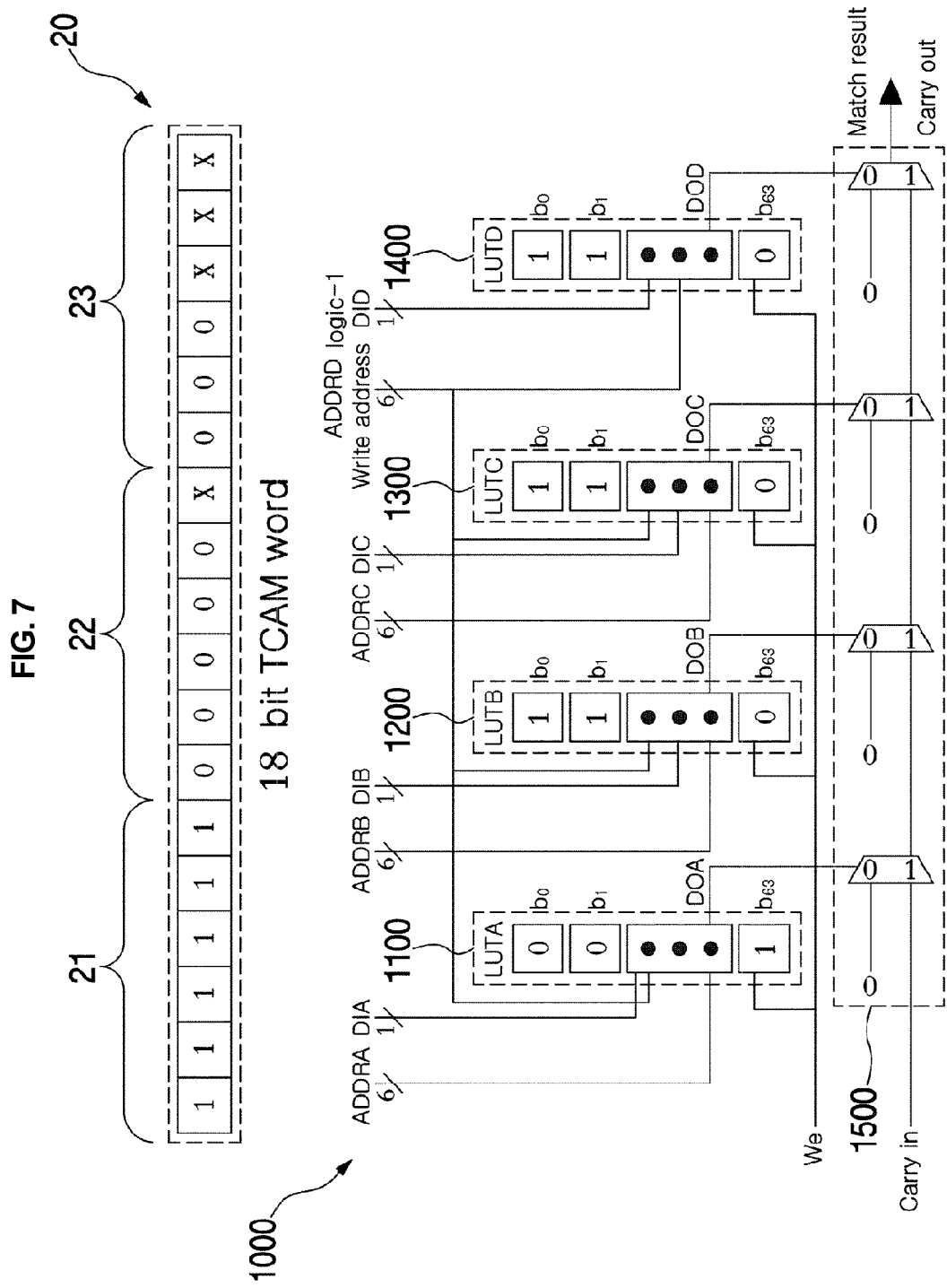
FIG. 7 is a diagram illustrating an FPGA-based TCAM architecture according to another embodiment of the present invention.

FIG. 7 is a diagram illustrating an FPGA-based TCAM architecture according to another embodiment of the present invention. With reference to FIG. 7, the FPGA-based TCAM architecture (hereinafter referred to as "TCAM architecture") according to the embodiment of the present invention is a TCAM architecture that is designed on the basis of a Field-Programmable Gate Array (FPGA).

Generally, a static random access memory (SRAM)-based TCAM suffers from longer update latencies and has to suspend search operations during an update process. This makes the search operations infeasible in applications that require high-frequency updates.

However, the present invention is directed to a dynamically re-configurable TCAM design on FPGAs. Distributed RAM resources in FPGAs are exploited by configuring look-up table RAMs (LUTRAMs) available in SliceM type logic slices as quad-port RAM.

Contemporary FPGA devices include configurable logic blocks (CLBs), programmable interconnect elements, clock distribution networks, block RAMs, digital signal processing slices, and external input/output blocks. The CLBs available on FPGA include two types of slices, "L" type slice and "M" type slice.

In addition, an FPGA slice includes four 6 input look-up tables (6 input LUTs).

In addition, the "M" type slice called SliceM can be configured as a look-up table RAM (LUTRAM) as well as a function generator for implementing logic, and the "L" type slice called SliceL can be configured as a function generator for implementing logic, not as a look-up table RAM.

In addition, the RAM constructed using the look-up table RAMs of SLice M is known as distributed RAM.

A TCAM architecture 1000 according to another embodiment of the present invention includes four 64-bit look-up table RAMs 1100, 1200, 1300, and 1400 of SliceM. Three look-up table RAMs 1100, 1200, 1300 (a look-up table RAM A, a look-up table RAM B, and a look-up table RAM C), as read ports, implements 18 TCAM bits, and the remaining look-up table RAM 1400 (a look-up table D) is used as a write port.

In addition, the four look-up table RAMs 1100, 1200, 1300, and 1400 share a common write address port. Four distinct bits are written to the look-up table RAMs using data in ports DIA, DIB, DIC, and DID. A write address is applied to the look-up table RAM D using an ADDRD port.

In addition, at the same time, address ports of the look-up table RAM A 1100, the look-up table RAM B 1200 and the look-up table RAM C 1300 are available for read. This structure makes a quad-port RAM with three read ports and with one write port.

In addition, each of the look-up table RAM A 1100, the look-up table RAM B 1200, and the look-up table RAM C 1300 has many bits, as many as the number of values that are representable by the search key (TCAM word).

In addition, the look-up table RAM A 1100, the look-up table RAM B 1200, and the look-up table RAM C 1300 implement an 18-bit TCAM word 20. A TCAM word 21 that is input into the look-up table RAM A 1100, a TCAM word 22 that is input into the look-up table RAM B 1200, and a TCAM word 23 that is input into the look-up table RAM C 1300 are each implemented as a 6-bit TCAM word.

In addition, the 6-bit TCAM word can represent 64 values. Thus, the look-up table RAM A 1100, the look-up table RAM B 1200, the look-up table RAM C 1300 are each made up of a 64-bit memory element.

For example, as illustrated in FIG. 7, in the look-up table RAM A 1100, "1" is written only in the most significant bit $b_{63}$ in order to implement a TCAM word, that is, "111111", and "0" is written in the remaining bits. In addition, in order to implement a TCAM word, that is, "000000x", in the look-up table RAM B 1200, "1" is written in the least significant bit $b_0$ in order to implement a TACM word, that is "000000", "1" is written in the second least significant bit b in order to implement a TCAM word, that is, "000001", and "0" is written in the remaining bits.

In addition, in order to implement "000xxx", in the look-up table RAM C 1300, "1" is written in 8 bits ("000000" to "000111" are implemented) starting with the least significant $b_0$, and "0" is written in the remaining bits.

That is, in the look-up table RAM A 1100, the look-up table RAM B 1200, the look-up table RAM C 1300, "1" is written in a bit that corresponds to a value of the search key, and "0" is written in bits that do not correspond to the value of the search key.

Then, when search keys to be searched for are input in parallel into the look-up table RAMs A, B, and C 1100, 1200, and 1300, direct access to the bit for the address corresponding to the value of the search key is made, and thus a match result can be outputted.

In addition, outputs from the look-up table RAMs A, B, and C 1100, 1200, and 1300 are ANDed through a carry chain 1500. Thus, a final match result is output.

In addition, in order to transfer the match result to a next slice (a slice that is connected in the width direction), the look-up table RAM D 1400 permanently initializes all bits to a logic value of "1".

In addition, the TCAM architecture can be extended with connections in the width direction and the depth direction.

On the other hand, in the TCAM architecture according to the present invention, direct access to an address of a look-up table RAM corresponding to the value of the search key is made, and a result indicating whether a match or a mismatch is found is output. Thus, values stored in the remaining bits that do not correspond to the value of the search key can be updated while at the same time conducting the search.

Figure 8:
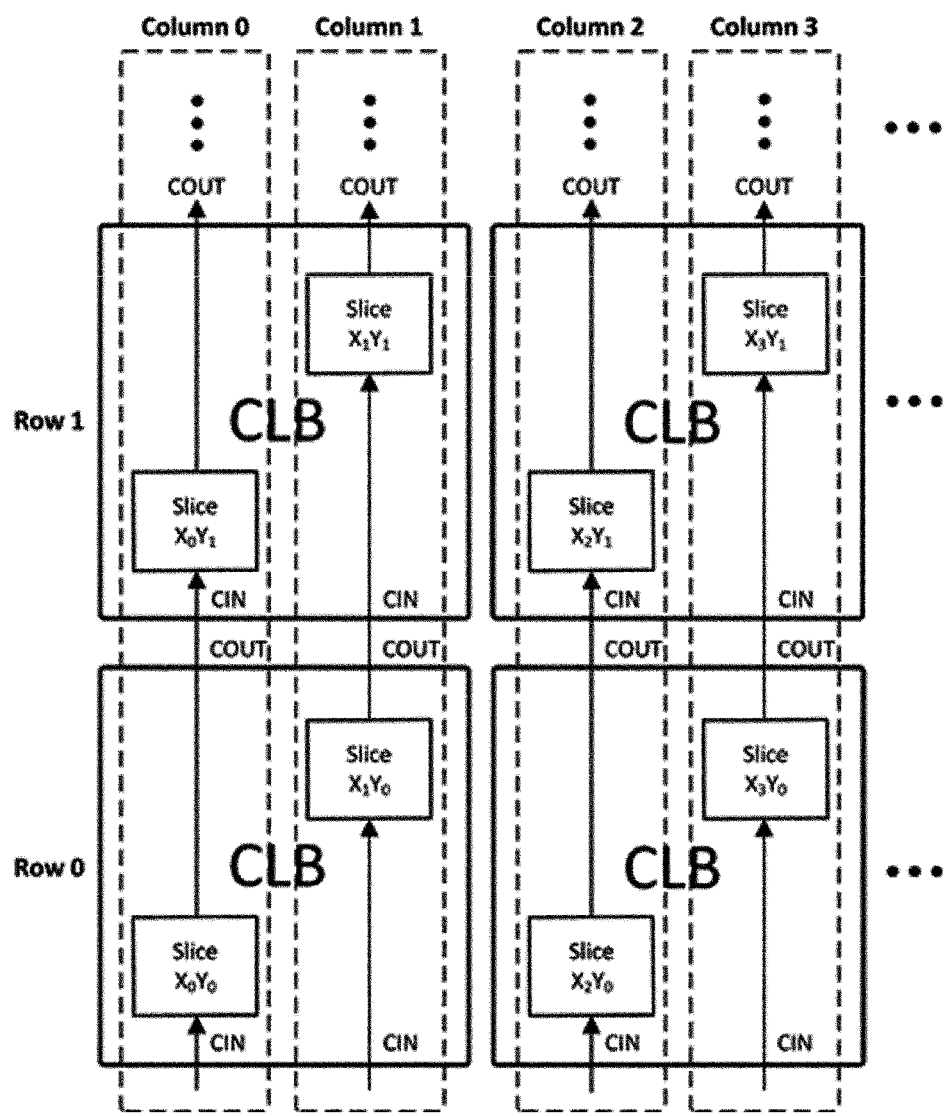
FIG. 8 is a diagram illustrating Carry Chain Structures of the present invention and FIG. 9 is a diagram for describing an update logic in the FPGA-based TCAM architecture according to the embodiment of the present invention.

FIG. 8 is a diagram illustrating Carry Chain Structures of the present invention. With reference to FIG. 8, the CLBs are the main logic implementation resources on FPGA. A CLB element on FPGAs contains several slices. Each slice on CLBs has an independent carry chain structure. The carry chain on a slice is hardwired and can be connected to the carry chain of the slices belonging to the same column in the next CLBs. Thus multiple slices sharing the same column are cascaded by connecting through carry chains as shown in FIG. 8.

Figure 9:
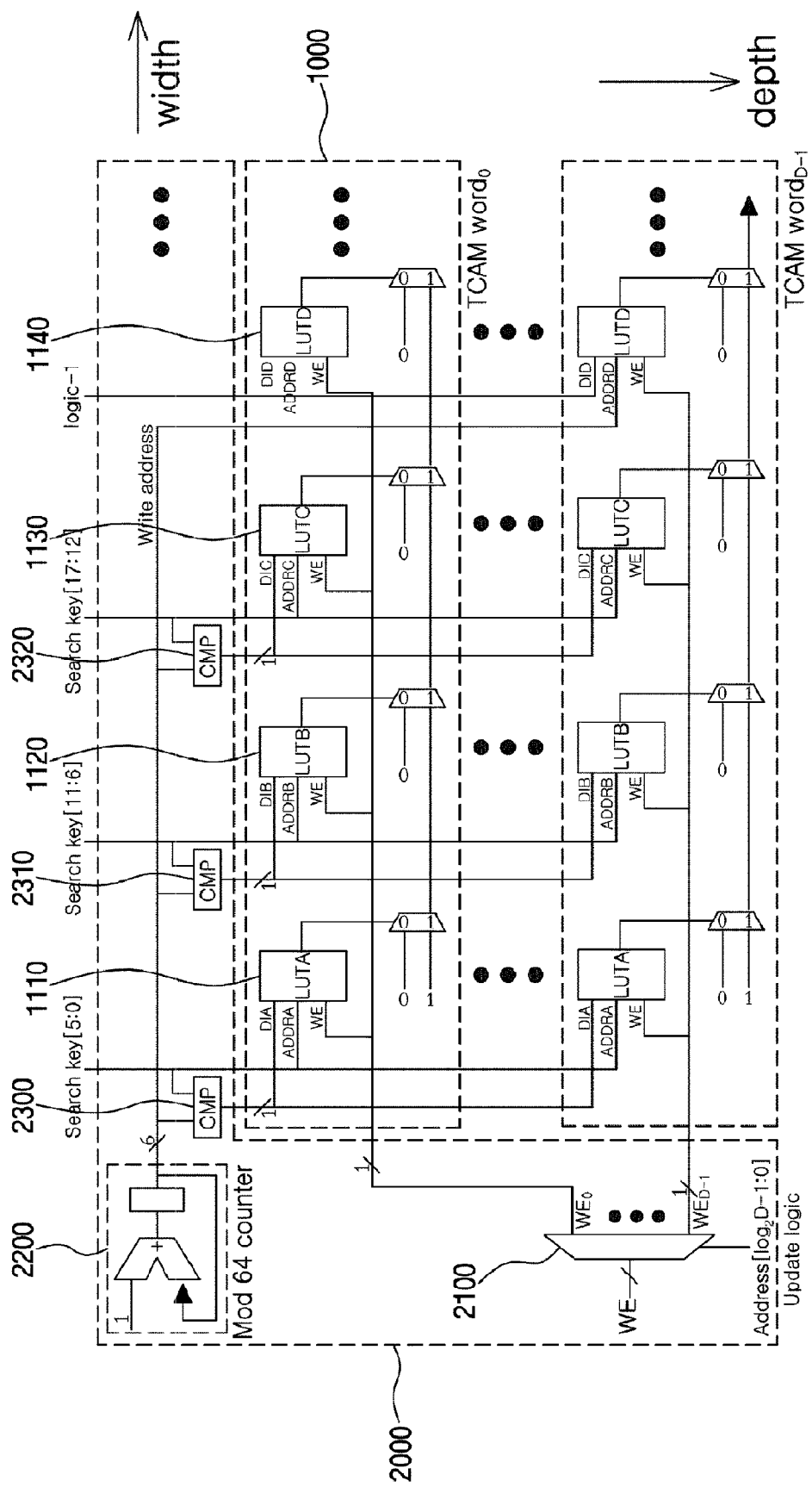

To this end, as illustrated in FIG. 9, an update logic 2000 may be included. The update logic 2000 includes a $\log_2 D$-bit decoder 2100, a MOD-64 counter 2200, and comparators 2300, 2310, and 2320.

The $\log_2 D$-bit decoder 2100 decodes and outputs an update address, and selects a row of a look-up table RAM implementing a TCAM word for write.

In all cycles, the MOD-64 counter 2200 generates and outputs a new 6-bit sequence (from "000000" to "111111").

The comparators 2300, 2310, and 2320 each compare a TCAM word for update and the 6-bit sequence that is generated in the MOD-64 counter 2200, and, if a match is found, records a logical value of "1" in the corresponding update address.

That is, during an update process, the remaining blocks are available for search operations, thereby allowing dynamic updates.

The present invention is not limited to the embodiments of the present invention, which are described above with reference to the drawings. It is apparent to a person of ordinary skill in the art that various amendments and alterations are possible within the scope that does not depart from the nature and gist of the present invention.

What is claimed is:

1. A FPGA-based TCAM architecture, wherein:
    multiple look-up tables are provided;
    outputs from the look-up table are ANDed through a carry chain, and thus a final match result is output;
    each of the look-up tables has many bits, as many as the number values that are representable by a search key that is input;
    "1" is written in a bit for an address corresponding to a value of the search key to be stored;
    "0" is written in the remaining bits;
    when the search key to be searched for is input into each of the look-up tables, a bit value for an address corresponding to the value of the search key that is input is output;
    in a case where "1" is output from all the look-up tables, "1" is output as a final match result;
    the search for the search key is conducted by having direct access to a bit for the address corresponding to the value of the search key to be searched for; and
    values stored in the remaining bits in the lookup table, which do not correspond to the address of the search key to be searched for, are updated while at the same time conducting the search for the search key.

2. The FPGA-based TCAM architecture according to claim 1, wherein:
    in the look-up tables, four 64-bit look-up table RAMs (LUTRAM) have a quad port RAM structure in which three look-up table RAMs, as read ports, implement 18 TCAM bits, and one look-up table RAM functions as a write port.

3. The FPGA-based TCAM architecture according to claim 2, comprising:
    a $\log_2 D$-bit decoder that outputs an update address of the look-up table RAM;
    a MOD-64 counter that generates and outputs a 6-bit sequence; and
    a comparator that compares an update word that is a value to be updated, and the 6-bit sequence of the MOD-64 counter, wherein
    the update word and the 6-bit sequence are consistent with each other in the update address, "1" is recorded in a bit for the update address.

* * * * *